(12) United States Patent
Zuehlsdorff et al.

(10) Patent No.: US 10,353,031 B2
(45) Date of Patent: Jul. 16, 2019

(54) SHIMMING METHOD FOR MAGNETIC RESONANCE IMAGING

(71) Applicants: Siemens Healthcare GmbH, Erlangen (DE); NorthShore University HealthSystem, Evanston, IL (US)

(72) Inventors: Sven Zuehlsdorff, Westmont, IL (US); Shivraman Giri, Chicago, IL (US); Robert R. Edelman, Highland Park, IL (US)

(73) Assignees: Siemens Healthcare GmbH, Erlangen, DE (US); NorthShore University HealthSystem, Evanston, IL (US)

( * ) Notice: Subject to any disclaimer, the term of this patent is extended or adjusted under 35 U.S.C. 154(b) by 720 days.

(21) Appl. No.: 14/928,372

(22) Filed: Oct. 30, 2015

(65) Prior Publication Data
US 2017/0123027 A1 May 4, 2017

(51) Int. Cl.
G01V 3/00 (2006.01)
G01R 33/3875 (2006.01)
G01R 33/483 (2006.01)
G01R 33/561 (2006.01)
G01R 33/565 (2006.01)

(52) U.S. Cl.
CPC ..... G01R 33/3875 (2013.01); G01R 33/4835 (2013.01); G01R 33/5614 (2013.01); G01R 33/56563 (2013.01)

(58) Field of Classification Search
CPC .................................................. G01R 33/3875
USPC ........................................ 324/309, 307, 306
See application file for complete search history.

(56) References Cited

U.S. PATENT DOCUMENTS

| | | | | |
|---|---|---|---|---|
| 6,472,872 B1 * | 10/2002 | Jack, Jr. | ............. | G01R 33/3875 324/307 |
| 7,683,614 B2 * | 3/2010 | Posse | .................. | G01R 33/485 324/307 |
| 8,138,759 B2 | 3/2012 | Greiser et al. | | |
| 8,332,010 B2 | 12/2012 | Edelman | | |
| 8,604,787 B2 * | 12/2013 | Posse | ..................... | A61B 5/055 324/309 |
| 9,041,396 B2 * | 5/2015 | Pfeuffer | ............... | G01R 33/243 324/307 |
| 2012/0235681 A1 | 9/2012 | Stemmer | | |
| 2016/0209487 A1 * | 7/2016 | Stern | ................. | G01R 33/4806 |

OTHER PUBLICATIONS

Shah et al., "Rapid Fieldmap Estimation for Cardiac Shimming", Proc. Intl. Soc. Mag. Reson. Med. 17:566 (2009).
Rothstein et al., "Artifact suppression of SSFP cine sequences at 3T using a novel automatic 3D shimming algorithm", Journal of Cardiovascular Magnetic Resonance 2013, 15(Suppl 1):P57.
Edelman et al., "Quiescent-Interval Single-Shot Unenhanced Magnetic Resonance Angiography of Peripheral Vascular Disease: Technical Considerations and Clinical Feasibility", Magn Reson Med. Apr. 2010 ; 63(4): 951-958.

(Continued)

*Primary Examiner* — Louis M Arana

(57) ABSTRACT

A method of acquiring magnetic resonance imaging (MRI) data of a subject includes dividing a region of interest into a plurality of slices, and acquiring the slices using an iterative process that interleaves acquisition of shim data covering the plurality of slices with acquisition of image data covering the slices over a plurality of iterations.

18 Claims, 7 Drawing Sheets

(56) References Cited

OTHER PUBLICATIONS

Thierfelder et al., "Non-Contrast-Enhanced MR Angiography at 3 Tesla in Patients with Advanced Peripheral Arterial Occlusive Disease", PLOS One Mar. 2014, vol. 9, Issue 3, e91078, pp. 1-7.

* cited by examiner

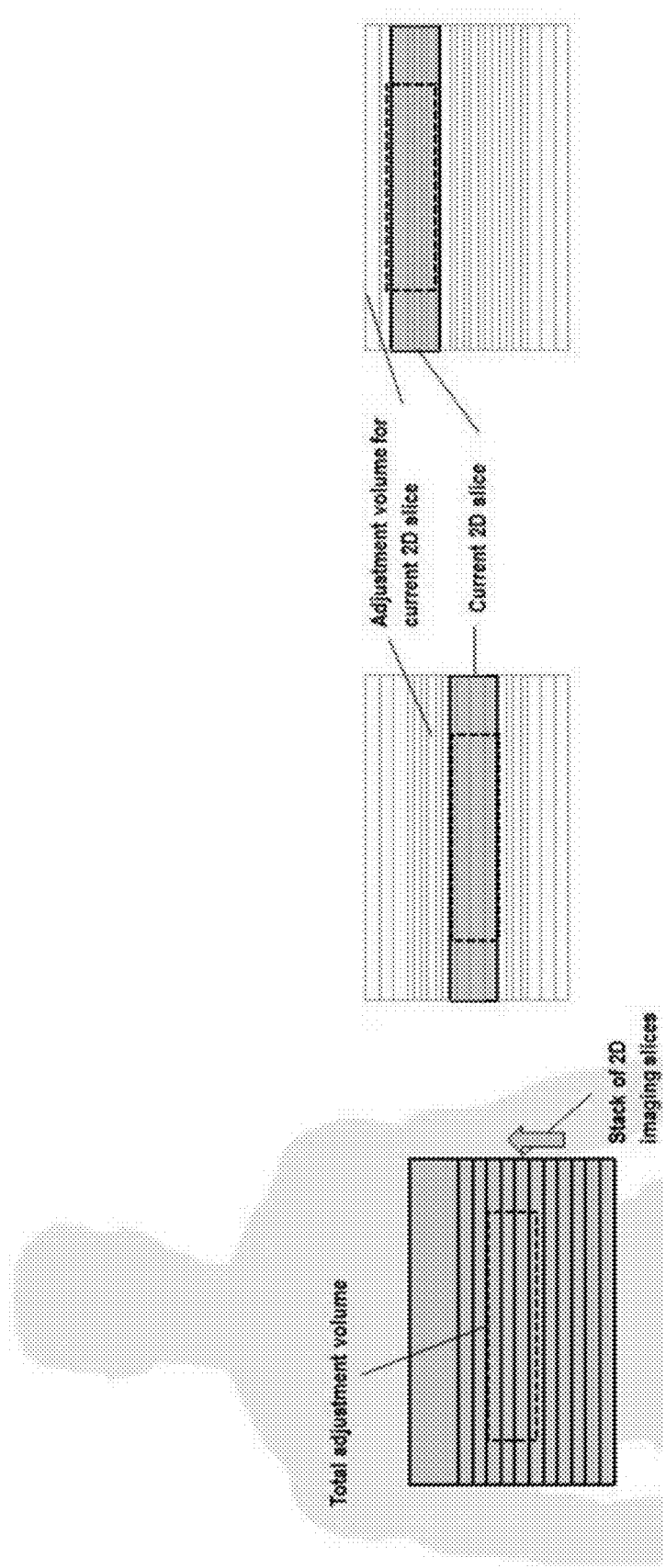

SHIMMING METHOD FOR MAGNETIC RESONANCE IMAGING

TECHNOLOGY FIELD

The present invention relates generally to methods, systems, and apparatuses for performing Magnetic Resonance Imaging (MRI) where shim data acquisition is integrated into or interleaved with slice acquisitions. The disclosed techniques may be applied to reduce the overall time required to acquire MRI datasets.

BACKGROUND

Magnetic Resonance Imaging (MRI) measures tissue-specific responses to a radio frequency (RF) stimulus in a strong main magnetic field (B0). Specifically, the magnetization of tissue is aligned with B0. An initial RF pulse tips the magnetization out of this alignment and rotates with a tissue-specific RF frequency resulting in a signal that is picked up with a receiver coil. Additional magnetic field gradient pulses (G) are used to spatially encode the RF signal that, in turn, is used to reconstruct an image.

MRI relies on a very homogeneous magnetic field B0. Unfortunately, the magnetic field of a clinical MR scanner typically exhibits inhomogeneity as a result of imperfections of the coil generating B0 and susceptibility interfaces between different types of tissue (e.g., lung and liver) that are highly patient dependent. The inhomogeneity of B0 can be compensated by adding additional magnetic fields generated by dedicated coils (shim coils) that are often described by a constant, linear, 2nd order and even higher order terms. Modern clinical scanners typically employ at least 2nd order shims.

Before acquiring clinical images in a patient, the existing inhomogeneity is often measured and corrected. MRI scanners estimate the magnetic field B0 by applying a dedicated MR sequence. Historically, a three dimensional (3D) multi-echo steady state sequence (e.g., Double Echo Steady State or "DESS") has been used. The phase evolution between the echoes is proportional to B0 and the resulting phase map can be converted into a field map. Finally, the field map is being used to derive shim currents that generate additional magnetic fields that compensate the inhomogeneity of B0.

More recently, multi-slice two dimensional (2D) multi-echo sequences have been introduced to generate a field map by acquiring a stack of 2D slices covering the area of interest. The data acquisition of a single 2D slice is faster than typical bulk, respiratory, cardiac and peristaltic motion of patients and results in a more reliable phase map than using a 3D DESS sequence and ultimately results in improved image quality. More advanced approaches implement different sets of shim currents for different portions of the scan volume (e.g., for an interleaved 2D multi-slice data acquisition) that further reduces effects from motion and ensures continuity of B0 across different portions of the scan volume. The shimming sequence is performed at least once per patient exam but typically repeated throughout the patient exam if certain criteria are being met such as changes of the region of interest, receiver coil configuration, etc.

SUMMARY

Embodiments of the present invention address and overcome one or more of the above shortcomings and drawbacks, by providing methods, systems, and apparatuses which combine shim data acquisition and slice acquisition for Magnetic Resonance Imaging (MRI) applications. The techniques described herein include interleaved and integrated approaches which may be applied to reduce the time needed to acquire MRI image data in many clinical scenarios.

According to some embodiments of the present invention, a method of acquiring magnetic resonance imaging (MRI) data of a subject includes dividing a region of interest into a plurality of slices, and acquiring the slices using an iterative process that interleaves acquisition of shim data covering the plurality of slices with acquisition of image data covering the slices over a plurality of iterations. Each respective iteration of the iterative process may include acquiring shim data covering a first subset of the plurality of slices covering a first portion of the region of interest, and acquiring a subset of the plurality of slices covering a second portion of the region of interest. The first and second portion of the region of interest may be the same or distinct, depending on the implementation of the method.

In some embodiments of the aforementioned method, prior to the iterative process, a shim dataset corresponding to a first set of 2D slices included in the plurality of slices is acquired. In these embodiments, the iterative process comprises: determining a shim adjustment volume for a particular set of 2D slices included in the plurality of slices, calculating shim currents for the shim adjustment volume using the shim dataset, acquiring the particular set of 2D slices included in the shim adjustment volume, and acquiring additional shim data to update the shim dataset. The aforementioned sets may be sized to include a single slice, or a larger number of slices depending on the implementation of the method.

In some embodiments of the aforementioned method (with or without the additional features described above), the iterative process uses a quiescent interval single shot acquisition scheme in which the plurality of slices are acquired within a quiescent phase of the subject's heartbeat using a balanced steady state free precession sequence. In these embodiments, the acquisition of the shim data covering the plurality of slices and the acquisition of the image data covering the plurality of slices may be performed, for example, on alternating heartbeats over the plurality of iterations.

According to another embodiment of the present invention, a second method of acquiring MRI data of a subject includes dividing a region of interest into a plurality of slices and acquiring the plurality of slices using an iterative process that integrates acquisition of shim data covering the plurality of slices with acquisition of image data covering the plurality of slices over a plurality of iterations. Each iteration may be performed during a heartbeat of the subject and comprise an acquisition of a subset of the image data during the heartbeat, and an acquisition of a subset of the shim data during a period of non-gradient activity within the heartbeat. In some embodiments, the subset of image data and the subset of shim data acquired during each iteration cover the same region of interest, while in other embodiments, the two subsets are distinct.

The period of non-gradient activity used in the second method discussed above may vary, according to different embodiments. For example, in some embodiments of the method, the iterative process uses a quiescent interval single shot acquisition scheme in which the subset of the image data is acquired following a quiescent phase of the subject's heartbeat using a balanced steady state free precession sequence. In these embodiments, the period of non-gradient activity may be the quiescent phase of the subject's heartbeat. During each iteration, shim currents for the subset of the image data may be updated prior to application of a first saturation pulse to the region of interest. In some embodiments, the period of non-gradient activity may correspond to, for example, a saturation time associated with the one or more saturation pulses, an inversion time associated with the one or more inversion pulses, or the timing of the one or more dummy heartbeats.

According to other embodiments, a system for acquiring magnetic resonance imaging (MRI) data of a subject includes a plurality of coils and a central control computer. The central control computer is configured to: divide a region of interest into a plurality of slices, and to use the coils to acquire the slices with an iterative process that interleaves acquisition of shim data covering the slices with image data covering those slices over a plurality of iterations. In some embodiments, the system further includes an electrocardiogram configured to acquire the subject's heartbeat and acquisition of the shim data is triggered based on the subject's heartbeat.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following FIGS.:

FIG. 2A outlines the patient along with a region of interest to be imaged with a stack of 2D imaging slices that may be acquired in a consecutive fashion, according to some embodiments;

FIG. 2B illustrates that, for individual slices (or currently acquired 2D slices) of the stack, the shim adjustment volume may be a sub-volume of the total adjustment volume;

FIG. 2C provides an alternate illustration of the shim adjustment volume as a sub-volume of the total adjustment volume;

DETAILED DESCRIPTION OF ILLUSTRATIVE EMBODIMENTS

The following disclosure describes the present invention according to several embodiments directed at methods, systems, and apparatuses related to performing Magnetic Resonance Imaging (MRI) with integrated shim data acquisition. Patient-specific shim is a critically important step in a patient exam. However, depending on the specific MR exam and desired region of interest, the shimming procedure can exceed the duration of the actual imaging scan. For example, it may be challenging (if not impossible) to scan a large region of interest such as the assessment of peripheral arteries, abdominal screening protocols or whole body scans in a time efficient manner using a moving table technology. The techniques described herein fully integrate or interleave the acquisition of shim data with the imaging sequence and continuously update shim currents with the goal of reducing scan time.

Figure 1:
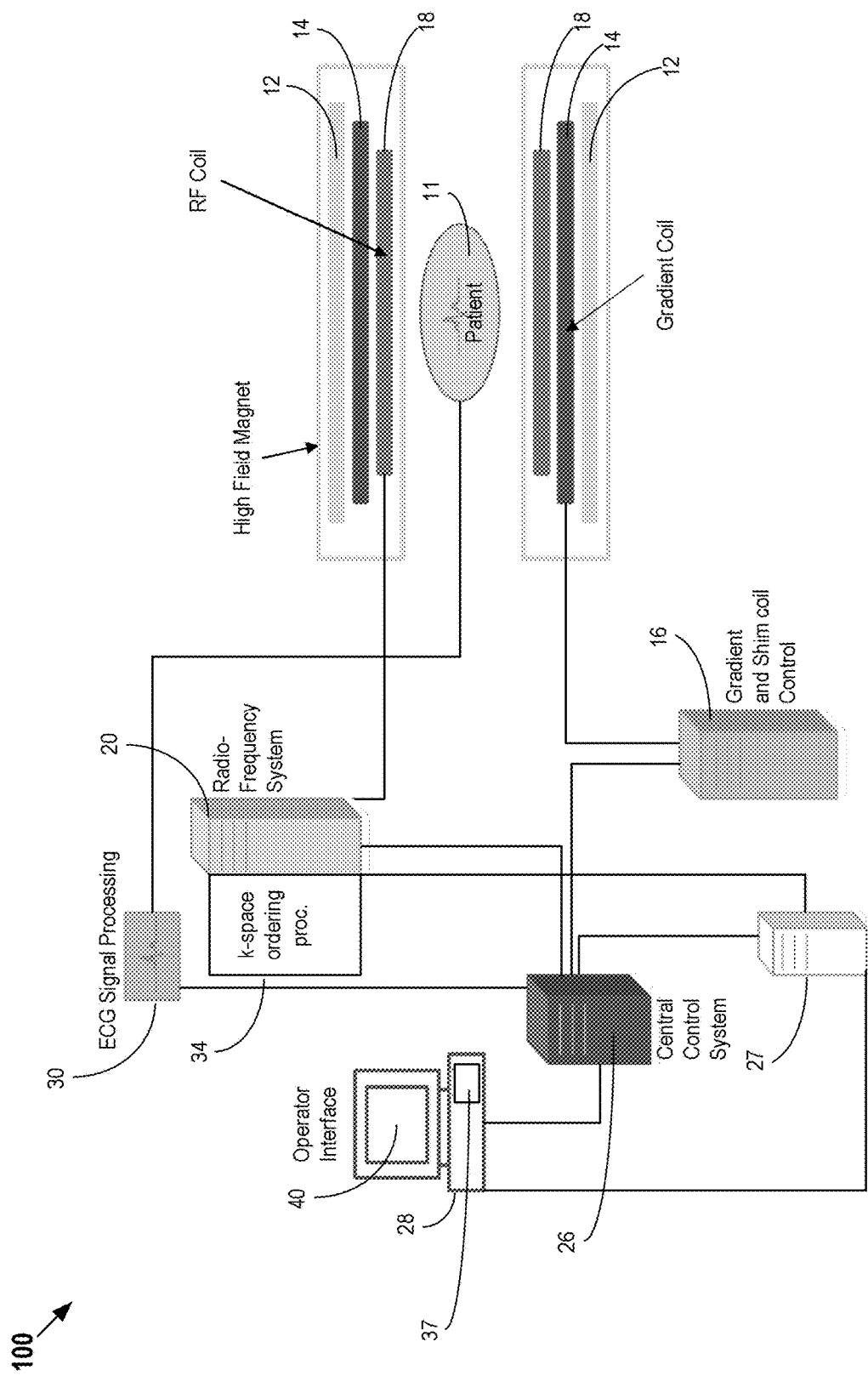
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. This system 100 is sometimes referred to herein collectively as the "MRI Scanner." In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components are substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, as described in greater detail below, an optimization algorithm is applied to iteratively solve a cost function which results in the reconstructed image.

FIGS. 2A-2C show the relationship between imaging slices and adjustment volume used for shimming, according to some embodiments. FIG. 2A shows a stack of 2D slices that cover a specific region of interest. Those 2D slices may be acquired in a sequential or interleaved fashion, or a number of slices may define sub stacks of slices. In the example of FIG. 2A, a sequential order of data acquisition is shown; however it should be understood that other acquisition orders may be applied. The total adjustment volume is the volume used by the shim procedure to optimize the magnetic field B0. During the shim procedure, the MR scanner acquires MR data that at least covers the total adjustment volume.

In a typical MR experiment, the total adjustment volume can be defined by the user. Alternatively, automatic or semi-automatic techniques may be used for defining the volume. Typically, the volume will include the specific region of interest. Subsequently, the MRI scanner acquires shim data covering the total adjustment volume and determines the best set of shim currents for this defined adjustment volume.

If the imaging sequence acquires a stack of 2D slices, the adjustment volume may be different and better described by smaller adjustment volumes for each currently acquired 2D slice. This is illustrated in FIGS. 2B and 2C. The adjustment volume for the current slice may contain at least parts of the current slice and may even overlap with adjustment volumes of other slices, but it is typically slightly larger than the current 2D slice. Consequently, for each slice a different set of shim currents and center frequency could be applied during acquisition.

In some embodiments, shim data may be acquired from a different slice than the current acquisition slice. For example, assume there are 10 consecutively numbered slices going up. After saturation of the first slice, it may be advantageous to acquire the shim data for the second slice rather than acquiring the shim data for the first slice. Then, when the next slice is to be acquired, nothing will have changed with respect to the shimming. So, the shim data acquired in the previous heartbeat can be used to set the shim adjustment for the second slice. This may be used, for example, in scenarios where the process of applying the RF pulses for the shimming reduces the signal that is being acquired in the slice.

Figures 3A, 3B:
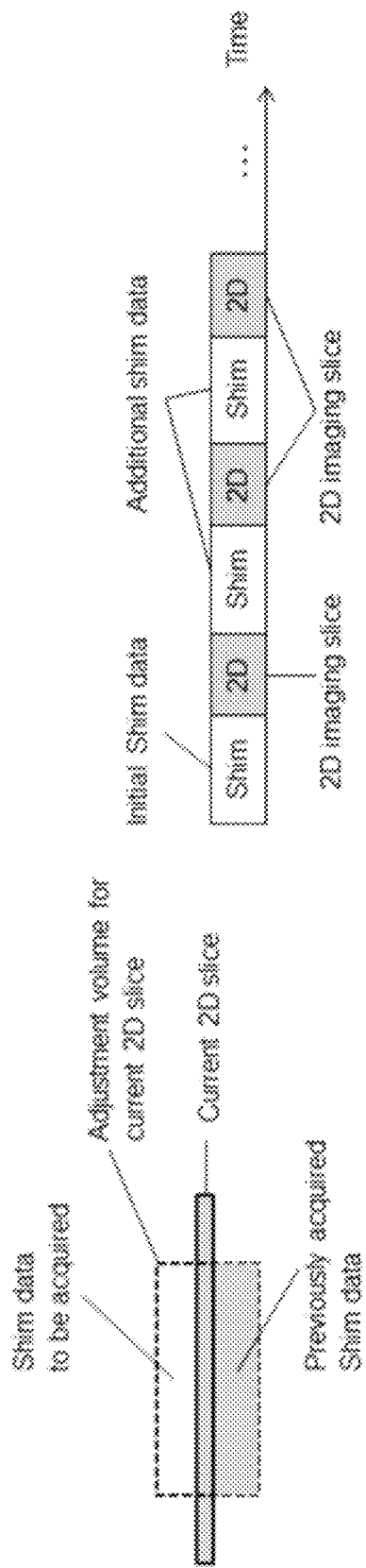
FIG. 3A illustrates a current 2D slice with corresponding desired adjustment volume, according to some embodiments.
FIG. 3B provides an illustration of an interleaving concept used in some embodiments in which imaging is alternated with shim data acquisition for each 2D imaging slice.

FIGS. 3A and 3B provide an illustration of a method the alternates the shim data acquisition with the image data acquisition, according to some embodiments of the present invention. Briefly, in an initial phase, a minimal amount of shim data is acquired to determine a set of shim currents for a first 2D slice, i.e., covering the adjustment volume for this first slice. For a subsequent slice, the shim data acquired thus far may be only partially complete for the corresponding adjustment volume for a subsequent slice; the missing shim data will be acquired before resuming the image data acquisition.

FIG. 3A shows a current 2D imaging slice where shim data for the adjustment volume is only partially available, for example, from (overlapping) adjustment volumes of previous slices. The sequence will interleave the imaging scan with the acquisition of additional shim data as shown in FIG. 3B. While FIGS. 3A and 3B illustrate the approach using individual slices, a predetermined number of slices could be considered as a subset of slices, depending on the specific application.

Figure 4:
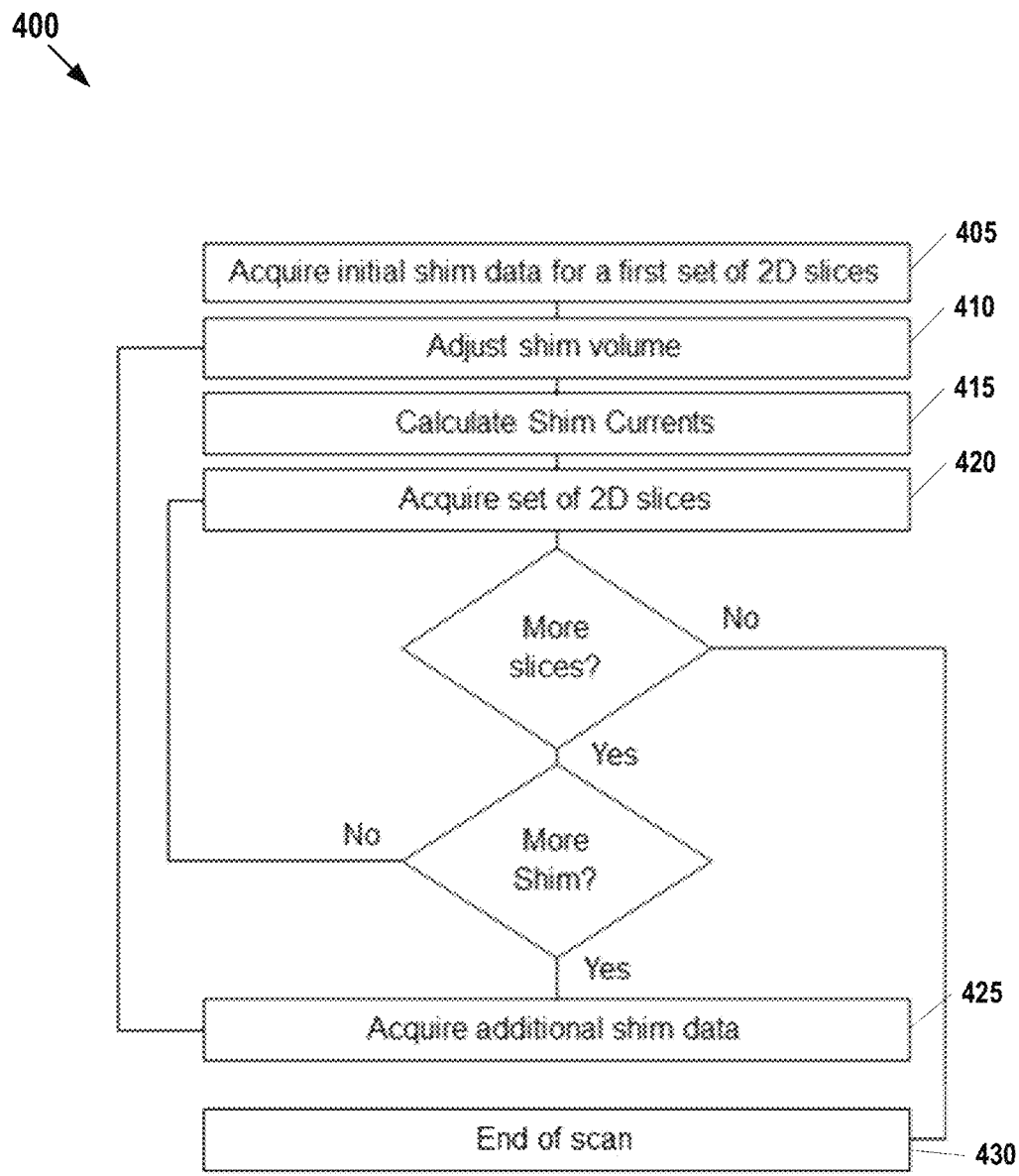
FIG. 4 provides a flow chart for a method of interleaved shim data acquisition, according to some embodiments.

FIG. 4 shows a flow chart for an interleaved shim data acquisition process 400 which uses subsets of slices, according to some embodiments. For each slice, it is assume that the adjustment value is known (e.g., within a predetermined distance from the center of the slice). Briefly, 2D slice acquisitions are interleaved with shim acquisitions such that for each slice one can adjust the shim current (i.e., what makes the stack homogenous for the region of interest). Starting at step 405, shim data is acquired for the first set of 2D slices. This provides a minimal set of data that will be used to calculate the shim currents without (yet) acquiring the full stack of slices. Next at step 410 the shim volume is adjusted accordingly and, at step 415 the shim current is calculated. Then, at step 420, a set of 2D slices is acquired where there is shim current.

Continuing with reference to FIG. 4, if the process has completed acquisition of the full stack of slices, the process ends at step 430. However, if there are more slices to be acquired, the previously calculated amount of shim data is evaluated to determine whether enough shim data has been acquired to adjust the volume for the next slice. If additional shim data is required, it is acquired at step 425 and the process repeats at step 410. Otherwise, the next set of 2D slices is acquired at step 425.

At step 405 a minimum amount of shim data is acquired for a first set of 2D slices (that may contain a single slice) using shim currents optimal for this initial set of slices. Subsequently, more sets of slices are being acquired. If the available shim data is not sufficient for the current set of slices, additional shim data is being acquired and shim currents for the current set of slices are determined.

While this appears counter-intuitive, an interleaved method can offer advantages over established shimming approaches. Conventionally, the entire shim data is acquired as adjustment prior to the imaging scan. The time-gap between shim data acquisition and imaging scan can result in reduced image quality due to patient motion. With the proposed interleaved approach, artifacts related to motion are reduced as the time between shim data acquisition and image data acquisition is minimized. Furthermore, the shim data acquisition can be tailored to the specific MRI application (e.g., adding cardiac triggering or honoring the breath-hold data acquisition of the imaging). Additionally, a careful integration of the shim may reduce the overall scan time and table top time.

Figure 5:
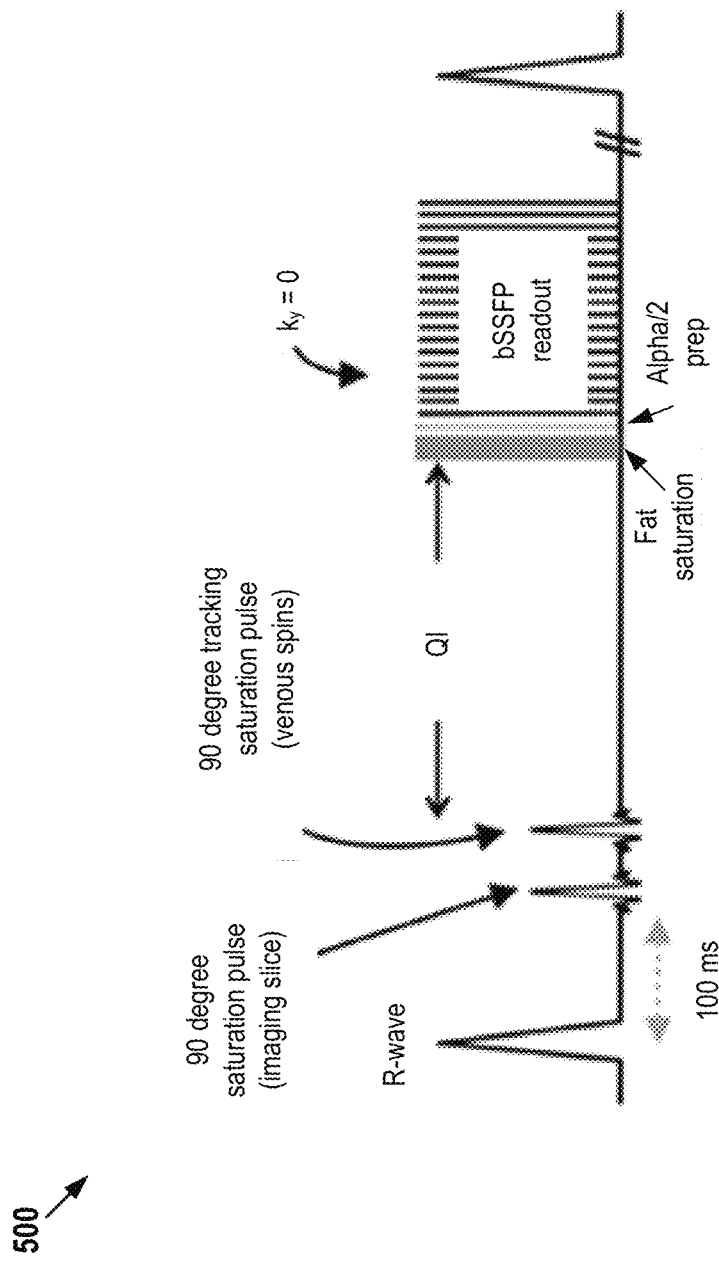
FIG. 5 provides an example of quiescent interval single shot (QISS) acquisition, as it may be applied in some embodiments, FIG. 6A provides an illustration of interleaving of acquisition of shim data in QISS imaging acquisition, according to some embodiments.

To illustrate the techniques described herein, FIG. 5 shows a conventional acquisition technique 500 that may be used to visualize peripheral arteries without the need to use MRI contrast agents. The technique, referred to as quiescent interval single shot or "QISS", acquires a 3D volume that is comprised of a stack of 2D slices. Each of those 2D slices is acquired within one heart beat as shown in FIG. 5. The image data acquisition is performed at the end of heart-beat, allowing for unsaturated blood to flow into the slice during the initial part of heart-beat (the temporal position within heart-beat is determined by identification of the R-wave of an electrocardiogram (ECG) signal). The image data is typically acquired by using a balanced steady State Free Precession (bSSFP) sequence that is catalyzed by applying an alpha/2 pulse to mitigate the establishment of the steady state (alpha is the flip angle used for the image data acquisition, for bSSFP alpha is typically 70-90 degrees). Prior to this data acquisition, a fat-saturation pulse eliminates an MR signal originating from lipids. Furthermore, two carefully placed preparation pulses eliminate an MR signal from static tissue within the imaging slice and venous blood, respectively. As a result, the primary signal for each 2D slice is that of arterial blood. The entire stack of slices is representing an arterial angiogram. Typical use of this approach is the assessment of peripheral arteries (e.g. in patients with diabetes) that requires large regions of interest (e.g. from pelvis to the feet). A practical implementation of such a protocol uses data acquisition at different table positions ("stations")—a multi-station approach that demonstrates added value in the management of patients with peripheral arterial occlusive disease.

One drawback of the QISS technique shown in FIG. 5 is that the use of a bSSFP sequence and the use of fat saturation pulses require an extraordinary high degree of homogeneity of the main magnetic field B0, and thus a robust shimming procedure, for the entire region of interest while limiting patient motion. Whereas the QISS image data acquisition is very fast (1 slice per hear beat), the shim data acquisition tends to be relatively slow, in some cases exceeding the time required for QISS image data acquisition.

FIG. 6A illustrates a technique for interleaving scans for a QISS data acquisition, according to some embodiments. Initial shim data is acquired for the first imaging slice for the QISS data acquisition. For subsequent slices, required additional shim data is acquired using extra heartbeats minimizing the gap between shim data acquisition and image data acquisition. Furthermore, shim currents are set optimized for the next 2D slice (depicted as star in FIG. 6A and steps "acquire additional shim data", "set adjustment volume" and "Calculate Shim Currents" in the process 400 illustrated in FIG. 4). It should be noted that, while the example of FIG. 6A a QISS sequence, the general approach illustrated in figure is compatible with any multi-2D slice data acquisition.

Note that the example of FIG. 6A may increase the overall time of the imaging scan. FIG. 6B illustrates an alternative method that uses an integrated approach, according to some embodiments of the present invention. The example of FIG. 6B fully integrates the shim data acquisition into the QISS image data acquisition, utilizing the gaps of non-gradient activity within the heartbeat (i.e., periods during which the coils associated with the scanners are not acquiring data). This example exhibits a higher complexity, but does not increase scan time of the imaging acquisition.

Figure 6:
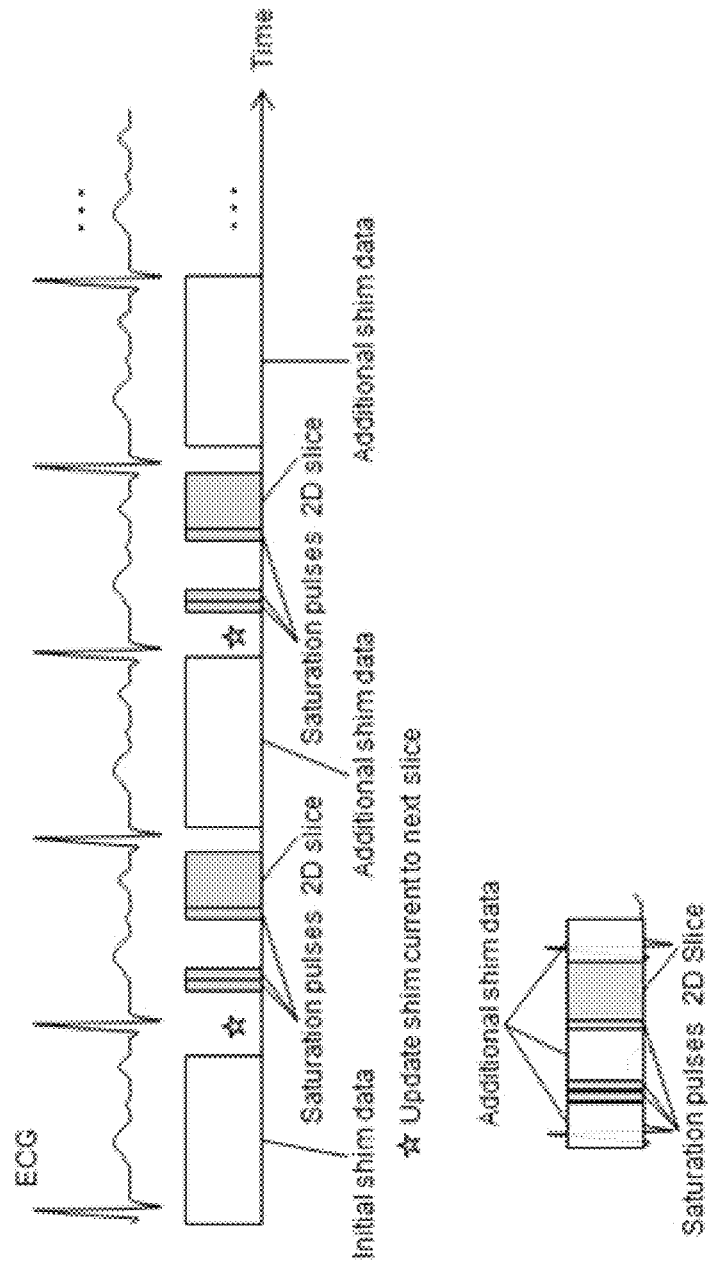
FIG. 6A provides an illustration of integrated acquisition of shim data in QISS imaging acquisition, according to some embodiments.

In FIG. 6B, grey boxes depict the basic QISS sequence timing similar to FIGS. 5 and 6. Additional shim data is acquired during the periods of non-activity of the QISS data acquisition (white, semitransparent boxes). Specifically, the time between image data acquisition and next saturation pulse, and time between saturation pulses and image data acquisition is being utilized. While this approach depends on the specific timing of the QISS sequence, most MRI data acquisition schemes exhibit gaps in the sequence (e.g., inversion time after saturation or inversion pulses, time to allow the magnetization to recover, dummy heart beats, etc.) that can be used for shim data acquisition. However, in scenarios where the integrated method depicted in FIG. 6B is infeasible, the interleaved method shown in FIG. 6A may be used as an alternative acquisition scheme. Additionally, the variations on the interleaved method set forth above may likewise be implemented with the integrated technique. For example, in some embodiments, for a given slice acquisition, shimming data may be acquired for a different set of slices than the slices currently being imaged in order to avoid any undesired effects of the shimming process on the imaged slices.

Figure 7:
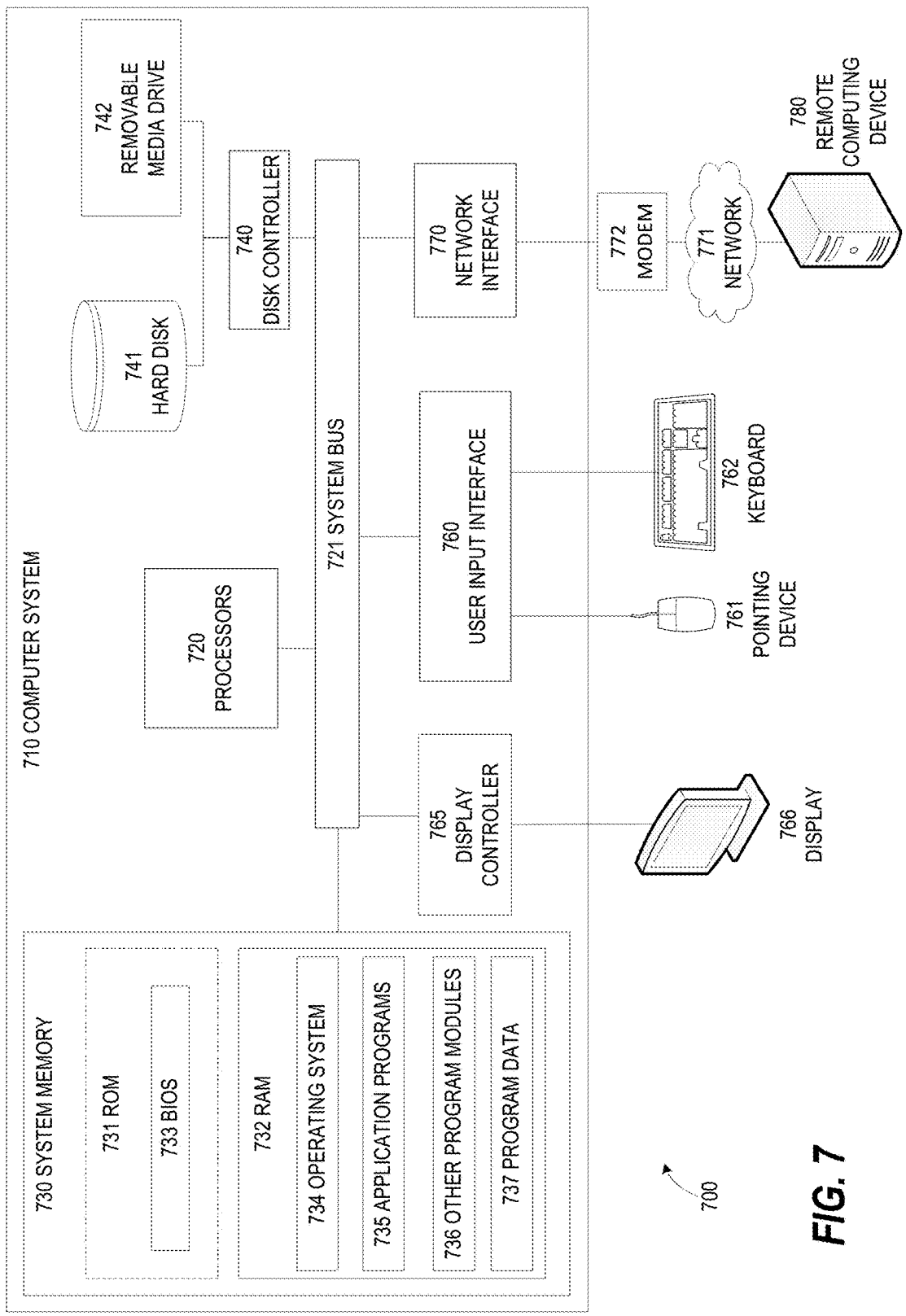
FIG. 7 illustrates an exemplary computing environment within which embodiments of the invention may be implemented.

FIG. 7 illustrates an exemplary computing environment 700 within which embodiments of the invention may be implemented. For example, this computing environment 700 may be used to implement the interleaved shim data acquisition process 400, described in FIG. 4. In some embodiments, the computing environment 700 may be used to implement one or more of the components illustrated in the system 100 of FIG. 1. The computing environment 700 may include computer system 710, which is one example of a computing system upon which embodiments of the invention may be implemented. Computers and computing environments, such as computer system 710 and computing environment 700, are known to those of skill in the art and thus are described briefly here.

As shown in FIG. 7, the computer system 710 may include a communication mechanism such as a bus 721 or other communication mechanism for communicating information within the computer system 710. The computer system 710 further includes one or more processors 720 coupled with the bus 721 for processing the information. The processors 720 may include one or more central processing units (CPUs), graphical processing units (GPUs), or any other processor known in the art.

The computer system 710 also includes a system memory 730 coupled to the bus 721 for storing information and instructions to be executed by processors 720. The system memory 730 may include computer readable storage media in the form of volatile and/or nonvolatile memory, such as read only memory (ROM) 731 and/or random access memory (RAM) 732. The system memory RAM 732 may include other dynamic storage device(s) (e.g., dynamic RAM, static RAM, and synchronous DRAM). The system memory ROM 731 may include other static storage device(s) (e.g., programmable ROM, erasable PROM, and electrically erasable PROM). In addition, the system memory 730 may be used for storing temporary variables or other intermediate information during the execution of instructions by the processors 720. A basic input/output system (BIOS) 733 containing the basic routines that help to transfer information between elements within computer system 710, such as during start-up, may be stored in ROM 731. RAM 732 may contain data and/or program modules that are immediately accessible to and/or presently being operated on by the processors 720. System memory 730 may additionally include, for example, operating system 734, application programs 735, other program modules 736 and program data 737.

The computer system 710 also includes a disk controller 740 coupled to the bus 721 to control one or more storage devices for storing information and instructions, such as a hard disk 741 and a removable media drive 742 (e.g., floppy disk drive, compact disc drive, tape drive, and/or solid state drive). The storage devices may be added to the computer system 710 using an appropriate device interface (e.g., a small computer system interface (SCSI), integrated device electronics (IDE), Universal Serial Bus (USB), or FireWire).

The computer system 710 may also include a display controller 765 coupled to the bus 721 to control a display 766, such as a cathode ray tube (CRT) or liquid crystal display (LCD), for displaying information to a computer user. The computer system includes an input interface 760 and one or more input devices, such as a keyboard 762 and a pointing device 761, for interacting with a computer user and providing information to the processors 720. The pointing device 761, for example, may be a mouse, a trackball, or a pointing stick for communicating direction information and command selections to the processor 720 and for controlling cursor movement on the display 766. The display 766 may provide a touch screen interface which allows input to supplement or replace the communication of direction information and command selections by the pointing device 761.

The computer system 710 may perform a portion of or all of the processing steps of embodiments of the invention in response to the processors 720 executing one or more sequences of one or more instructions contained in a memory, such as the system memory 730. Such instructions may be read into the system memory 730 from another computer readable medium, such as a hard disk 741 or a removable media drive 742. The hard disk 741 may contain one or more datastores and data files used by embodiments of the present invention. Datastore contents and data files may be encrypted to improve security. The processors 720 may also be employed in a multi-processing arrangement to execute the one or more sequences of instructions contained in system memory 730. In alternative embodiments, hard-wired circuitry may be used in place of or in combination with software instructions. Thus, embodiments are not limited to any specific combination of hardware circuitry and software.

As stated above, the computer system 710 may include at least one computer readable medium or memory for holding instructions programmed according to embodiments of the invention and for containing data structures, tables, records, or other data described herein. The term "computer readable medium" as used herein refers to any medium that participates in providing instructions to the processors 720 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 741 or removable media drive 742. Non-limiting examples of volatile media include dynamic memory, such as system memory 730. Non-limiting examples of transmission media include coaxial cables, copper wire, and fiber optics, including the wires that make up the bus 721. Transmission media may also take the form of acoustic or light waves, such as those generated during radio wave and infrared data communications.

The computing environment 700 may further include the computer system 710 operating in a networked environment using logical connections to one or more remote computers, such as remote computer 780. Remote computer 780 may be a personal computer (laptop or desktop), a mobile device, a server, a router, a network PC, a peer device or other common network node, and typically includes many or all of the elements described above relative to computer system 710. When used in a networking environment, computer system 710 may include modem 772 for establishing communications over a network 771, such as the Internet. Modem 772 may be connected to bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computer 780). The network 771 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method of acquiring magnetic resonance imaging (MRI) data of a subject, the method comprising:
   dividing a region of interest into a plurality of slices; and
   acquiring the plurality of slices using an iterative process that interleaves acquisition of shim data covering the plurality of slices with acquisition of image data covering the plurality of slices over a plurality of iterations, wherein the iterative process uses a quiescent interval single shot acquisition scheme, in which the plurality of slices are acquired within a quiescent phase of the subject's heartbeat using a balanced steady state free precession sequence, and the shim data is acquired during a period of non-activity of the quiescent interval single shot acquisition scheme.

2. The method of claim 1, wherein each respective iteration of the iterative process comprises:
   acquiring shim data covering a first subset of the plurality of slices covering a first portion of the region of interest; and
   acquiring a subset of the plurality of slices covering a second portion of the region of interest.

3. The method of claim 2, wherein the first portion of the region of interest and the second portion of the region of interest are distinct.

4. The method of claim 2, wherein the first portion of the region of interest and the second portion of the region of interest are the same.

5. The method of claim 1, further comprising:
   prior to the iterative process, acquiring a shim dataset corresponding to a first set of 2D slices included in the plurality of slices,
   wherein the iterative process comprises:
      determining a shim adjustment volume for a particular set of 2D slices included in the plurality of slices,
      calculating shim currents for the shim adjustment volume using the shim dataset;
      acquiring the particular set of 2D slices included in the shim adjustment volume;
      acquiring additional shim data to update the shim dataset.

6. The method of claim 5, wherein the first set of 2D slices is sized to include a single slice.

7. The method of claim 5, wherein the particular set of 2D slices is sized to include a single slice.

8. The method of claim 5, wherein the acquisition of the shim data covering the plurality of slices and the acquisition of the image data covering the plurality of slices is performed on alternating heartbeats over the plurality of iterations.

9. A method of acquiring magnetic resonance imaging (MRI) data of a subject, the method comprising:
   dividing a region of interest into a plurality of slices; and
   acquiring the plurality of slices using an iterative process that integrates acquisition of shim data covering the plurality of slices with acquisition of image data covering the plurality of slices over a plurality of iterations, wherein each iteration is performed during a heartbeat of the subject and comprises:
      acquiring a subset of the image data during the heartbeat, and
      acquiring a subset of the shim data during a period of non-gradient activity within the heartbeat,
      wherein the iterative process uses a quiescent interval single shot acquisition scheme in which the subset of the image data is acquired following a quiescent phase of the subject's heartbeat using a balanced steady state free precession sequence.

10. The method of claim 9, wherein the subset of the image data covers a first portion of the region of interest and the subset of the shim data covers a second portion of the region of interest that is distinct from the first portion.

11. The method of claim 9, wherein each subset of image data is sized to include a single slice.

12. The method of claim 9, wherein the period of non-gradient activity is the quiescent phase of the subject's heartbeat.

13. The method of claim 9, further comprising:
during each iteration, updating shim current for the subset of the image data prior to application of a first saturation pulse to the region of interest.

14. The method of claim 9, wherein the acquisition of the subset of the image data is performed using one or more saturation pulses and the period of non-gradient activity corresponds to a saturation time associated with the one or more saturation pulses.

15. The method of claim 9, wherein the acquisition of the subset of the image data is performed using one or more inversion pulses and the period of non-gradient activity corresponds to an inversion time associated with the one or more inversion pulses.

16. The method of claim 9, wherein the acquisition of the subset of the image data is performed using one or more dummy heartbeats and the period of non-gradient activity corresponds to timing of the one or more dummy heartbeats.

17. A system for acquiring magnetic resonance imaging (MRI) data of a subject, the system comprising:
a plurality of coils; and
a central control computer configured to:
divide a region of interest into a plurality of slices, and
use the plurality of coils to acquire the plurality of slices with an iterative process that interleaves acquisition of shim data covering the plurality of slices with image data covering the plurality of slices over a plurality of iterations,
wherein the iterative process uses a quiescent interval single shot acquisition scheme, in which the plurality of slices are acquired within a quiescent phase of the subject's heartbeat using a balanced steady state free precession sequence, and the shim data is acquired during a period of non-activity of the quiescent interval single shot acquisition scheme.

18. The system of claim 17, further comprising:
an electrocardiogram configured to acquire the subject's heartbeat,
wherein the acquisition of the shim data is triggered based on the subject's heartbeat.

* * * * *